US010810396B2

(12) United States Patent
Jia et al.

(10) Patent No.: US 10,810,396 B2
(45) Date of Patent: Oct. 20, 2020

(54) FINGERPRINT IDENTIFICATION APPARATUS AND ELECTRONIC DEVICE

(71) Applicant: BOE Technology Group Co., Ltd., Beijing (CN)

(72) Inventors: Yanan Jia, Beijing (CN); Haisheng Wang, Beijing (CN); Chun Wei Wu, Beijing (CN); Yingming Liu, Beijing (CN); Rui Xu, Beijing (CN); Lijun Zhao, Beijing (CN); Changfeng Li, Beijing (CN); Yuzhen Guo, Beijing (CN); Pengpeng Wang, Beijing (CN); Yanling Han, Beijing (CN); Xiaoliang Ding, Beijing (CN); Wei Liu, Beijing (CN); Jing Lv, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 206 days.

(21) Appl. No.: 15/748,913

(22) PCT Filed: Jul. 21, 2017

(86) PCT No.: PCT/CN2017/093827
§ 371 (c)(1),
(2) Date: Jan. 30, 2018

(87) PCT Pub. No.: WO2018/126644
PCT Pub. Date: Jul. 12, 2018

(65) Prior Publication Data

US 2019/0005295 A1 Jan. 3, 2019

(30) Foreign Application Priority Data

Jan. 3, 2017 (CN) .......................... 2017 1 0001752

(51) Int. Cl.
*G06K 9/00* (2006.01)
*G02F 1/335* (2006.01)
(Continued)

(52) U.S. Cl.
CPC ..... *G06K 9/0004* (2013.01); *G02F 1/133514* (2013.01); *G06K 9/00046* (2013.01);
(Continued)

(58) Field of Classification Search
CPC .............. G06K 9/0004; G06K 9/00046; H01L 27/3244; H01L 27/124; H01L 23/5329;
(Continued)

(56) References Cited

U.S. PATENT DOCUMENTS

2003/0081839 A1* 5/2003 Tseng ...................... G06T 9/004 382/232
2006/0250365 A1* 11/2006 Yu ...................... G06F 3/03544 345/163

(Continued)

FOREIGN PATENT DOCUMENTS

CN 103117571 A 5/2013
CN 103309503 A 9/2013
(Continued)

OTHER PUBLICATIONS

Oct. 18, 2017—(WO) International Search Report and Written Opinion Appn PCT/CN2017/093827 with English Tran.
Jan. 31, 2018—(CN) First Office Action Appn 201710001752.3 with English Tran.

*Primary Examiner* — Ming Y Hon
(74) *Attorney, Agent, or Firm* — Banner & Witcoff, Ltd.

(57) ABSTRACT

A fingerprint identification apparatus and an electronic device having the fingerprint identification apparatus. The fingerprint identification apparatus includes: a first substrate; a second substrate disposed opposite to the first substrate; and a fingerprint identification sensor disposed between the
(Continued)

first substrate and the second substrate, where the fingerprint identification sensor comprises a plurality of photoelectric induction units, and each of the photoelectric induction units comprises a curved photoelectric induction part.

17 Claims, 6 Drawing Sheets

(51) Int. Cl.

| | |
|---|---|
| ***H01L 23/532*** | (2006.01) |
| ***G02F 1/1335*** | (2006.01) |
| ***H01L 27/12*** | (2006.01) |
| ***H01L 27/32*** | (2006.01) |
| ***H01L 27/30*** | (2006.01) |
| *G02F 1/1333* | (2006.01) |

(52) U.S. Cl.
CPC ........ *H01L 23/5329* (2013.01); *H01L 27/124* (2013.01); *H01L 27/1248* (2013.01); *H01L 27/307* (2013.01); *H01L 27/3244* (2013.01); *G02F 1/13338* (2013.01)

(58) Field of Classification Search
CPC ............... H01L 27/1248; H01L 27/307; G02F 1/133514; G02F 1/13338
See application file for complete search history.

(56) References Cited

U.S. PATENT DOCUMENTS

| | | | | |
|---|---|---|---|---|
| 2011/0204077 | A1* | 8/2011 | Gu | G07B 5/02 221/30 |
| 2012/0105787 | A1* | 5/2012 | Gotoh | G02F 1/1368 349/139 |
| 2015/0060252 | A1 | 3/2015 | Wang et al. | |
| 2015/0198699 | A1* | 7/2015 | Kuo | G01S 7/52017 367/7 |
| 2016/0224817 | A1* | 8/2016 | Yang | G06K 9/0002 |
| 2017/0076131 | A1* | 3/2017 | Jeong | G06K 9/0002 |
| 2017/0091508 | A1* | 3/2017 | Han | G06F 3/041 |
| 2017/0160582 | A1* | 6/2017 | He | G02F 1/133528 |
| 2017/0161541 | A1 | 6/2017 | Li et al. | |
| 2017/0286739 | A1* | 10/2017 | Shibano | G06K 9/0002 |
| 2017/0344148 | A1* | 11/2017 | Han | G06F 3/0416 |
| 2018/0060635 | A1* | 3/2018 | Li | G06K 9/0002 |

FOREIGN PATENT DOCUMENTS

| | | | |
|---|---|---|---|
| CN | 104267857 | A | 1/2015 |
| CN | 105095872 | A | 11/2015 |
| CN | 105975963 | A | 9/2016 |
| CN | 106611170 | A | 5/2017 |
| KR | 200500200436 | A | 3/2005 |

* cited by examiner

FINGERPRINT IDENTIFICATION APPARATUS AND ELECTRONIC DEVICE

The application is a U.S. National Phase Entry of International Application No. PCT/CN2017/093827 filed on Jul. 21, 2017, designating the United States of America and claiming priority to Chinese Patent Application No. 201710001752.3, filed Jan. 3, 2017. The present application claims priority to and the benefit of the above-identified applications and the above-identified applications are incorporated by reference herein in their entirety.

TECHNICAL FIELD

Embodiments of the present disclosure relate to a fingerprint identification apparatus and an electronic device having the fingerprint identification apparatus.

BACKGROUND

With rapid development of display technologies, electronic devices with a biometric identification function have gradually entered into people's life and work, where a fingerprint identification technology has become one of the most widely used and inexpensive identification technologies in biometric identification technologies due to its uniqueness and stability, and has attracted more and more attention. The application fields of the fingerprint identification technology are also wider and wider.

Currently, the fingerprint identification technology in an electronic device generally adopts an optical technology, a silicon technology (capacitive and radio), and an ultrasonic technology, etc. It is easy to generate parasitic capacitance between electrodes at both ends of a capacitor in the capacitive fingerprint identification and internal components of a display panel in the electronic device, and a fingerprint detection signal and a display signal may interfere with each other, so as to affect accuracy of the fingerprint identification. Therefore, in the fingerprint identification technology, the optical technology is more advantageous than the capacitive technology, and an optical fingerprint identification sensor may implement detection and identification functions by detecting light reflected from a human finger. In order to achieve the fingerprint identification in a display field of the electronic device, the optical fingerprint identification sensor needs to be disposed in a non-display area between pixel units in the display field. In order to ensure an aperture ratio of pixels, an area provided for the optical fingerprint identification sensor is very limited, and the area of the optical fingerprint identification sensor is small, leading to a small absorption light area, and a low photocurrent being generated. Thus, it is easy to produce errors for fingerprint detection and identification.

SUMMARY

At least one embodiment of the present disclosure provides a fingerprint identification apparatus, which comprises: a first substrate; a second substrate disposed opposite to the first substrate; and a fingerprint identification sensor disposed between the first substrate and the second substrate. The fingerprint identification sensor comprises a plurality of photoelectric induction units, and each of the photoelectric induction units comprises a curved photoelectric induction part.

For example, in the fingerprint identification apparatus provided by an embodiment of the present disclosure, each photoelectric induction unit comprises a first electrode, a second electrode and a photoelectric induction layer sandwiched between the first electrode and the second electrode.

For example, in the fingerprint identification apparatus provided by an embodiment of the present disclosure, one of the first electrode and the second electrode is an opaque electrode and another of the first electrode and the second electrode is a transparent electrode.

For example, in the fingerprint identification apparatus provided by an embodiment of the present disclosure, the curved photoelectric induction part comprises a prism surface, a pyramid surface, a trapezoidal surface, a spherical surface or a cylindrical surface.

For example, the fingerprint identification apparatus provided by an embodiment of the present disclosure further comprises a driving circuit, the driving circuit is configured to drive the photoelectric induction unit, and the driving circuit comprises a thin film transistor.

For example, the fingerprint identification apparatus provided by an embodiment of the present disclosure further comprises an interlayer insulating layer, the thin film transistor, the interlayer insulating layer and the fingerprint identification sensor are sequentially disposed on the first substrate, and the thin film transistor and the fingerprint identification sensor overlap with each other in a direction perpendicular to the first substrate.

For example, in the fingerprint identification apparatus provided by an embodiment of the present disclosure, the thin film transistor and the fingerprint identification sensor are disposed on the first substrate, and the thin film transistor and the fingerprint identification sensor are disposed side-by-side in a direction perpendicular to the first substrate.

For example, the fingerprint identification apparatus provided by an embodiment of the present disclosure further comprises a first insulating layer and an interlayer insulating layer, the first insulating layer is disposed on the second substrate, the first insulating layer comprises a first recess, the photoelectric induction unit, the interlayer insulating layer and the thin film transistor are sequentially disposed in the first recess, and the thin film transistor and the fingerprint identification sensor overlap with each other in a direction perpendicular to the second substrate.

For example, the fingerprint identification apparatus provided by an embodiment of the present disclosure further comprises a second insulating layer, the second insulating layer is disposed on the second substrate, the second insulating layer comprises a second recess, and the photoelectric induction unit is disposed in the second recess; the thin film transistor is disposed on the first transistor, the thin film transistor is electrically connected to the photoelectric induction unit through a conductive spacer; or, the thin film transistor is disposed on the second transistor, in a direction perpendicular to the second substrate, the thin film transistor does not overlap with the photoelectric induction unit.

At least one embodiment of the present disclosure provides an electronic device, which comprises the fingerprint identification apparatus described in any one of the above embodiments.

For example, the electronic device provided by an embodiment of the present disclosure further comprises a display panel, and the display panel and the fingerprint identification apparatus are formed integrally.

For example, in the electronic device provided by an embodiment of the present disclosure, the display panel comprises a plurality of pixel units, and each of the plurality of photoelectric induction units of the fingerprint identification apparatus is disposed between the plurality of pixel units of the display panel.

For example, in the electronic device provided by an embodiment of the present disclosure, the display panel comprises an array substrate and an opposed substrate, the array substrate corresponds to the first substrate of the fingerprint identification apparatus, and the opposed substrate corresponds to the second substrate of the fingerprint identification apparatus.

For example, in the electronic device provided by an embodiment of the present disclosure, the display panel is a liquid crystal display panel, and the opposed substrate is a color filter substrate.

For example, in the electronic device provided by an embodiment of the present disclosure, the display panel is an organic light-emitting diode display panel, and the opposed substrate is a package substrate.

BRIEF DESCRIPTION OF THE DRAWINGS

In order to clearly illustrate the technical solutions of embodiments of the present disclosure, the drawings of the embodiments will be briefly described in the following; it is obvious that the drawings in the description are only related to some embodiments of the present disclosure and not limitative to the present disclosure.

DETAILED DESCRIPTION

Figure 1:
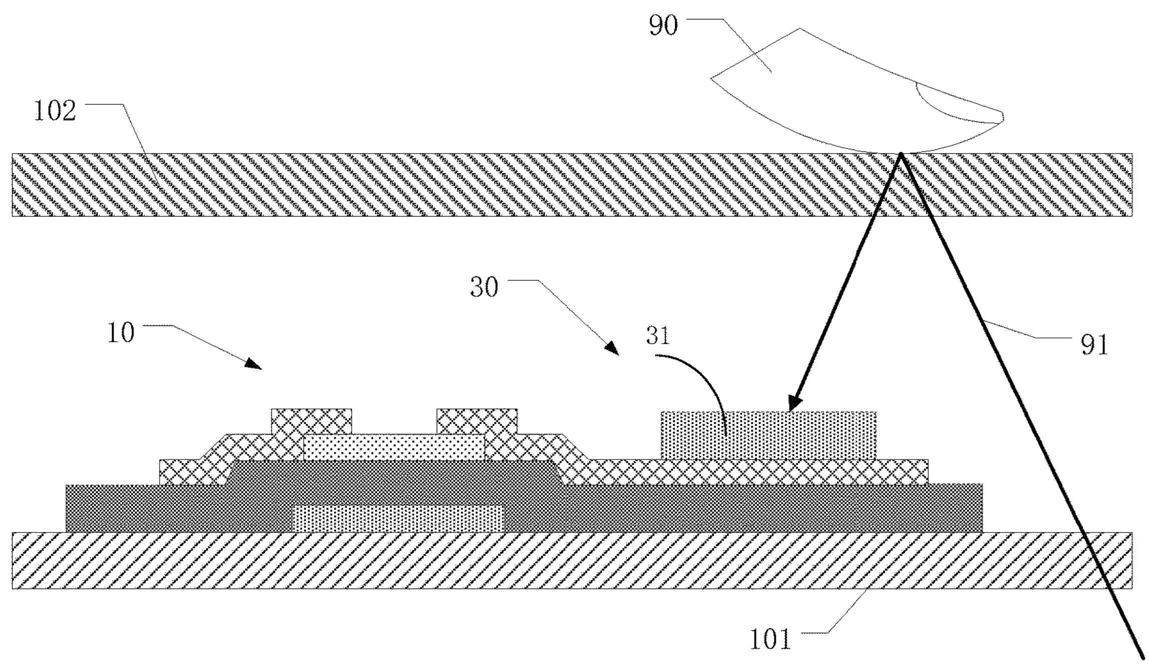
FIG. 1 is a partial cross-sectional schematic diagram of an optical fingerprint identification apparatus.

In order to make objects, technical solutions and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "include," etc., are intended to specify that the elements or the objects stated before these terms encompass the elements or the objects and equivalents thereof listed after these terms, but do not preclude the other elements or objects. The phrases "connect", "connected", etc., are not intended to confine to a physical connection or mechanical connection, but may include an electrical connection, regardless of being directly or indirectly connected. "On," "under," "right," "left" and the like are only used to indicate relative position relationship, and when the position of the object which is described is changed, the relative position relationship may be changed accordingly.

Each component or structure in the drawings is not drawn in strict scale, and for clarity, the size of each component or structure may be exaggerated or reduced, such as increasing the thickness of the layer, the width of the electrode and etc., but these should not be used to limit the scope of the present disclosure.

FIG. 1 is a partial cross-sectional schematic diagram of an optical fingerprint identification apparatus.

As shown in FIG. 1, an optical fingerprint identification apparatus comprises: a first substrate 101, a second substrate 102, a thin film transistor 10 and a fingerprint identification sensor 30. Light 91 emitted by a light source (not shown in figure) is incident on a finger 90 that is in contact with or approaching the second substrate 102, the finger 90 reflects the incident light 91, and the reflected light irradiates on the fingerprint identification sensor 30, and a photoelectric induction unit 31 of the fingerprint identification sensor 30 converts optical signals of the reflected light into current signals. Because geometric characteristics of ridge lines of a fingerprint and geometric characteristics of valley lines of a fingerprint are different, and the ridge lines are convex and the valley lines are concave, in a case that the ridge lines and the valley lines are irradiated by the light, reflection intensities of the ridge lines and the valley lines are also different, so that the current signals obtained by respective photoelectric induction units 31 of the fingerprint identification sensor 30 are also different. The fingerprint identification is achieved by detecting the sizes of the current signals.

The optical fingerprint identification apparatus may be disposed in an active area (AA) of a display device, for example, disposed in a non-display part between pixel units. In this case, in order to ensure that the display device has a sufficient aperture ratio, areas for manufacturing respective photoelectric induction units 31 of the fingerprint identification sensor 30 are very limited. A photosensitive surface of the photoelectric induction unit 31 of the fingerprint identification sensor 30 is a flat surface, and an area of the photosensitive surface is relatively small. During a fingerprint identification process, the received optical signals are small, the generated current signals are small, and the performance and accuracy of the fingerprint identification are low. In addition, the fingerprint identification apparatus further needs to separately provide a light shielding layer disposed above the thin film transistor 10 which is used for driving the photoelectric induction unit 31, so as to prevent external light from irradiating on the thin film transistor 10 to affect electrical performance thereof. However, a lateral surface of the thin film transistor 10 may still be affected by irradiation of the light, so that performance of the thin film transistor 10 is affected. The fingerprint identification apparatus has many manufacturing procedures and a high production cost.

At least one embodiment of the present disclosure provides a fingerprint identification apparatus and an electronic device having the fingerprint identification apparatus.

A fingerprint identification apparatus according to an embodiment of the present disclosure comprises: a first substrate; a second substrate disposed opposite to the first substrate; and a fingerprint identification sensor disposed between the first substrate and the second substrate. The fingerprint identification sensor comprises a plurality of photoelectric induction units, and each of the photoelectric induction units comprises a curved photoelectric induction part.

The fingerprint identification apparatus can be formed integrally with a display device, and thus, the photoelectric induction area is increased by using the curved photoelectric induction part of the photoelectric induction unit without affecting the aperture ratio of the display device, so as to increase induction photocurrent signals, improve the accuracy of the fingerprint detection and identification, and achieve fingerprint detection with high quality.

For example, in the fingerprint identification apparatus provided by an embodiment of the present disclosure, a first electrode may be an opaque electrode, the first electrode may cover above a thin film transistor in a driving circuit, and a top surface and four lateral sides (front, back, left and right) of the thin film transistor can be covered by the first electrode, so as to better block the external ambient light and improve the stability of the thin film transistor; in addition, a step of separately forming a light shielding layer on the thin film transistor can be reduced, so that productivity can be further increased, the cost can be saved, and the process steps can be reduced.

A few embodiments of the present disclosure are described in detail below, but the present disclosure is not limited to these specific embodiments.

First Embodiment

Figure 2A:
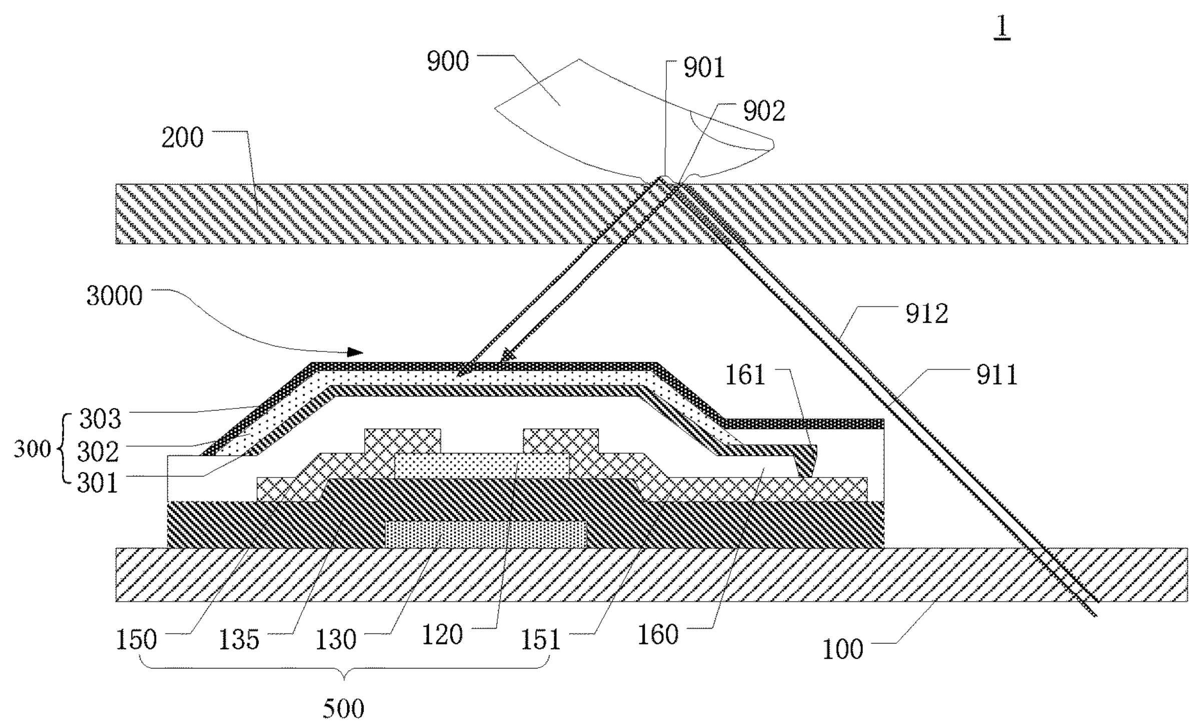
FIG. 2A is a partial cross-sectional schematic diagram of a fingerprint identification apparatus provided by an embodiment of the present disclosure.

FIG. 2A is a partial cross-sectional schematic diagram of a fingerprint identification apparatus provided by an embodiment, and FIG. 2A only shows a part of the relevant structures so as to illustrate the fingerprint identification apparatus more clearly.

As shown in FIG. 2A, a fingerprint identification apparatus 1 of the embodiment comprises: a first substrate 100, a second substrate 200 and a fingerprint identification sensor. The second substrate 200 is disposed opposite to the first substrate 100. The fingerprint identification sensor is disposed between the first substrate 100 and the second substrate 200, the fingerprint identification sensor comprises a plurality of photoelectric induction units 300, and each of the photoelectric induction units 300 comprises a curved photoelectric induction part 3000. Thus, an area of the photoelectric induction units 300 used for photoelectric induction at least includes a non-planar part. Compared with a planar part, the non-planar part has a larger surface area when occupying the same projected area (occupied area) on the first substrate 100, so that a photoelectric induction area may be larger, and more photo-generated charges are generated.

Figure 2B:
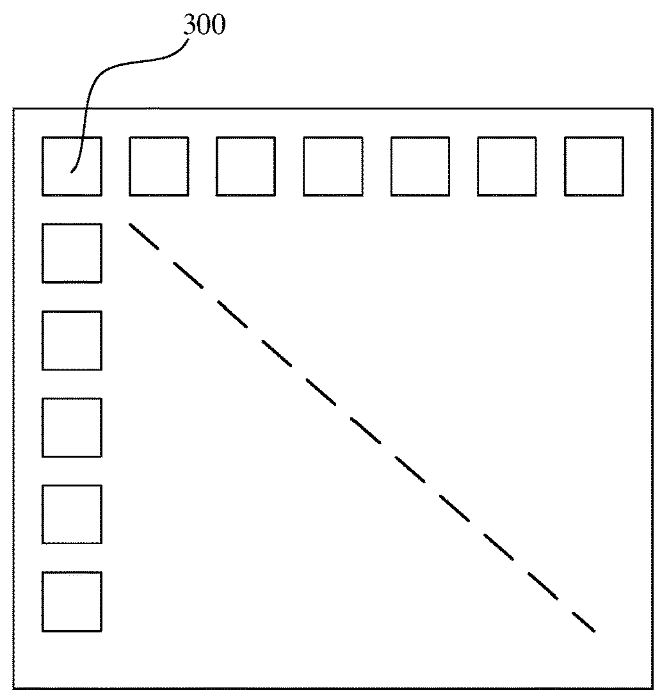
FIG. 2B is a schematic plan view of an exemplary fingerprint identification sensor provided by an embodiment of the present disclosure.
Figure 2C:
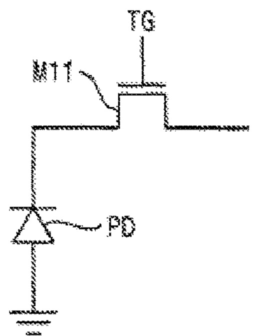
FIG. 2C is a circuit diagram of a photoelectric induction unit of an exemplary fingerprint identification sensor provided by an embodiment of the present disclosure.

FIG. 2B is a schematic plan view of a fingerprint identification sensor. As shown in FIG. 2B, the fingerprint identification sensor comprises a plurality of photoelectric induction units 300, and the plurality of photoelectric induction units 300 may be arranged in an array with m rows and n columns (m, n being integers). FIG. 2C is a schematic circuit diagram of each photoelectric induction unit 300. As shown in FIG. 2C, each photoelectric induction unit may comprise a photodiode (PD). In order to output photo-charges generated by the photodiode due to light irradiation, each photoelectric induction unit may be provided with a read switch transistor M11. For example, a gate electrode of the read switch transistor M11 is connected to a row scanning line, a source electrode of the read switch transistor M11 is connected to each photoelectric induction unit, and a drain electrode of the read switch transistor M11 is connected to a column scanning line. The photoelectric induction unit is not limited to include the photodiode, but may also include other suitable elements, such as a phototransistor or the like.

For example, the first substrate 100 may be a transparent substrate, such as a glass substrate, a quartz substrate, or other suitable substrates.

For example, the second substrate 200 may be a transparent substrate, such as a glass substrate, a quartz substrate, a plastic substrate, or other substrates that can be in contact with a finger 900.

For example, the fingerprint identification apparatus provided by the embodiment may further comprise a driving circuit, and the driving circuit is used to drive the photoelectric induction unit 300. The driving circuit comprises a thin film transistor 500, and the thin film transistor 500 can be used as a signal-reading switch of a corresponding photosensitive induction unit 300. According to needs, the driving circuit also may comprise elements such as a storage capacitor, a transmission transistor and the like, and the embodiments of the present disclosure are not limited to the specific structure of the driving circuit.

For example, as shown in FIG. 2A, the fingerprint identification apparatus provided by the embodiment may further comprise an interlayer insulating layer 160 between the thin film transistor 500 and the photoelectric induction unit 300. The thin film transistor 500, the interlayer insulating layer 160 and the photoelectric induction unit 300 are sequentially disposed on the first substrate 100, and the thin film transistor 500 and the photoelectric induction unit 300 are configured to overlap with each other in a direction perpendicular to the first substrate 100. The thin film transistor 500 comprises a gate electrode 130, a gate insulating layer 135, an active layer 120, a third electrode 150 and a fourth electrode 151. Here, the third electrode 150 may be a source electrode or a drain electrode, and correspondingly, the fourth electrode 151 may be the drain electrode or the source electrode. For example, the photoelectric induction unit 300 comprises a first electrode 301, a second electrode 303 and a photoelectric induction layer 302 sandwiched between the first electrode 301 and the second electrode 303. The interlayer insulating layer 160 comprises a first via hole 161 for exposing a part of the fourth electrode 151, and the first electrode 301 is electrically connected to the fourth electrode 151 through the first via hole 161. It is to be noted that, although only one photoelectric induction unit 300 of the fingerprint identification apparatus is shown in the figure, one of ordinary skill in the art may know that a plurality of photoelectric induction units 300 may be disposed on the first substrate 100.

For example, the thin film transistor 500 may be a bottom-gate thin film transistor or a top-gate thin film transistor. As shown in FIG. 2A, in the embodiment, the thin film transistor 500 is a bottom-gate thin film transistor. For the bottom-gate thin film transistor, the gate electrode 130 may prevent the light coming from a side of the first substrate 100 from irradiating onto the active layer 120; for the top-gate thin film transistor, a light shielding layer may be additionally formed to block the light coming from a side of the first substrate 100 from irradiating onto the active layer 120.

For example, materials of the third electrode 150, the fourth electrode 151 and the gate electrode 130 may comprise copper-based metals, aluminum-based metals, nickel-based metals, and so on. The copper-based metals have characteristics of low resistivity and good conductivity, so as to improve signal transmission ratios of the source electrode and the drain electrode.

For example, a material used for the active layer 120 may be amorphous silicon, polysilicon, oxide semiconductor or other suitable materials. The polysilicon may be high temperature polysilicon or low temperature polysilicon, and the oxide semiconductor, for example, may be indium gallium zinc oxide (IGZO), indium zinc oxide (IZO), zinc oxide (ZnO) or gallium zinc oxide (GZO), etc.

For example, an example material for forming the gate insulating layer 135 comprises silicon nitride (SiNx), silicon oxide (SiOx), silicon oxynitride (SiNxOy) or other suitable materials.

A principle of implementing the fingerprint identification by the fingerprint identification apparatus provided by an embodiment of the present disclosure is described below in conjunction with FIG. 2A. As shown in FIG. 2A, light 911 and light 912 (such as, visible light or infrared light) emitted by a light source (not shown in figure) irradiate through the first substrate 100 onto the finger 900 that is in contact with or approaching the second substrate 200, uneven ridge lines 902 and valley lines 901 on the finger 900 (only the ridge lines and the valley lines of part of a fingerprint of the finger 900 are shown in FIG. 2A, referring to wavy lines in the figure for details) reflects the light, but directions, intensities and the like of the light reflected by the ridge lines 902 and the valley lines 901 are different. In general, an intensity of the light reflected by a ridge line 902 of the finger 900 is greater than an intensity of the light reflected by a valley line 901 of the finger 900, and the reflected light of different intensities enters the photoelectric induction unit 300 in the fingerprint identification sensor. The photoelectric induction layer 302 in the photoelectric induction unit 300 absorbs the optical signals reflected by the ridge lines 902 and the valley lines 901 of the finger 900 and converts the received optical signals into current signals. The current signals are transmitted to the thin film transistor 500 through the first electrode 301 that is electrically connected to the fourth electrode 151 under action of an electric field formed by the first electrode 301 and the second electrode 303, and then the current signals are transmitted to a touch chip (not shown) through the thin film transistor 500. During a process that the finger 900 contacts with the surface of the second substrate 200, the touch chip detects the difference of the current signals output by the photoelectric induction unit 300 at different times, and a fingerprint two-dimensional pattern of the finger 900 formed by the ridge lines 902 and the valley lines 901 can be obtained by combining the output signals of the plurality of photoelectric induction units 300, so as to achieve fingerprint identification. In the fingerprint identification apparatus provided by the embodiment, the curved photoelectric induction part 3000 can increase the area in which the fingerprint identification sensor receives light, so that the optical signals absorbed by the photoelectric induction layer 302 increase, the generated current signals increase, and the obtained fingerprint two-dimensional pattern is clearer and more accurate, so as to improve the accuracy of the fingerprint identification.

It is to be noted that, although only one photoelectric induction unit 300 is shown in the figure, one of ordinary skill in the art may know that one valley-ridge period of the finger 900 needs to correspond to at least one (for example, multiple) photoelectric induction unit 300, which is beneficial for ensuring the clarity of identifying the fingerprint and improving the accuracy of the fingerprint identification.

Furthermore, in the embodiment, the light used for fingerprint identification may be emitted by a light source disposed inside the fingerprint identification apparatus. For example, the light source may be a light emitting element (such as an OLED light emitting element) disposed on the first substrate 100. The light source may also be a light source disposed outside the fingerprint identification apparatus. For example, the light source may be a backlight source (for example, a backlight source for a liquid crystal display device) disposed in a direction of the first substrate 100 away from the second substrate 200.

Figure 3:
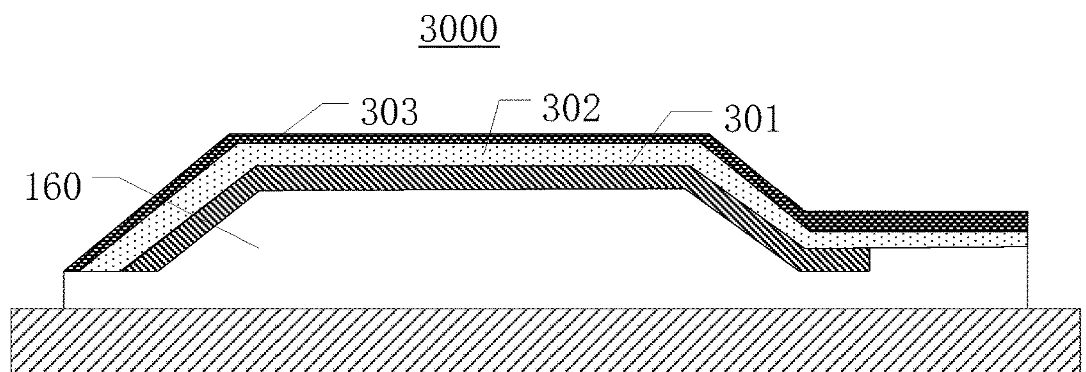
FIG. 3 is a partial structural schematic diagram of an implementation mode of a curved photoelectric induction part 3000 shown in FIG. 2A.
Figure 4:
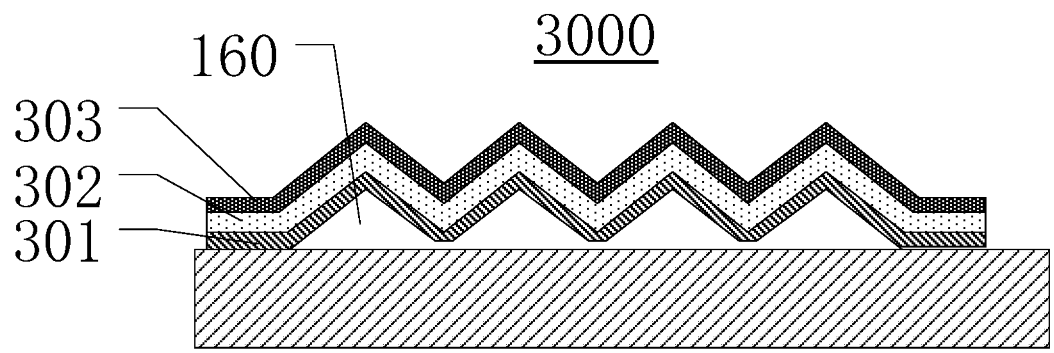
FIG. 4 is a partial structural schematic diagram of another implementation mode of a curved photoelectric induction part 3000 shown in FIG. 2A.
Figure 5:
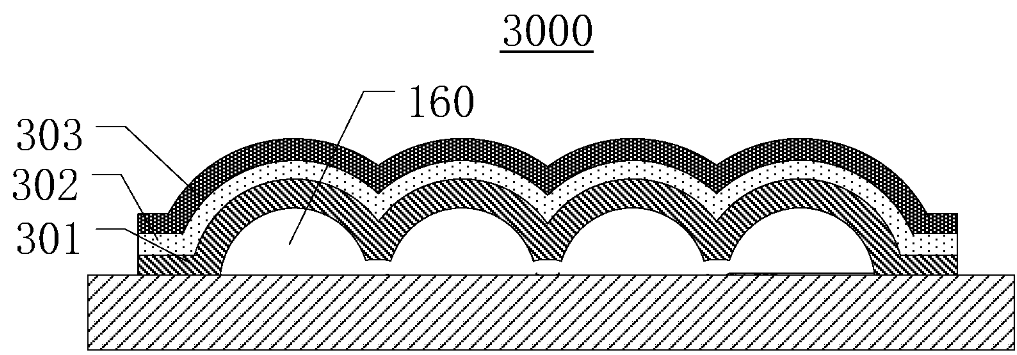
FIG. 5 is a partial structural schematic diagram of yet another implementation mode of a curved photoelectric induction part 3000 shown in FIG. 2A.

FIG. 3 to FIG. 5 are partial structure diagrams of different implementation modes of the curved photoelectric induction part 3000 provided by the embodiment.

For example, the whole photoelectric induction unit 300 may be a prism, a pyramid, a trapezoid, a sphere or a cylinder, and the like, so as to achieve the curved photoelectric induction part 3000; alternatively, a part of the photoelectric induction unit 300 may be any of the above-mentioned curved structure, so as to achieve the curved photoelectric induction part 3000.

FIG. 3 is a partial structural schematic diagram of a curved photoelectric induction part 3000 in the fingerprint identification apparatus provided by the embodiment. As shown in FIG. 3, in this implementation mode, the curved photoelectric induction part 3000 comprises a trapezoidal surface. After forming the thin film transistor 500, a convex structure is naturally formed on an upper side of the thin film transistor 500, and by using the convex structure, the interlayer insulation layer 160 having a cross-section view of a trapezoidal protrusion is formed on the upper side of the thin film transistor 500 without taking extra trouble; alternatively, the interlayer insulation layer 160 having a cross-section view of a plurality of (for example, four) trapezoidal protrusions in a periodic pattern may be formed. Then, the first electrode 310, the photoelectric induction layer 302 and the second electrode 303 consistent with the shape of the interlayer insulating layer 160 are sequentially formed on the interlayer insulating layer 160; and the first electrode 310, the photoelectric induction layer 302 and the second electrode 303 have corresponding curved surface shapes, so as to constitute the curved photoelectric induction part 3000.

As shown in FIG. 3, two waist sides of the trapezoid of the curved photoelectric induction part 3000 may also absorb the optical signals, so that the area in which the photoelectric induction layer 302 absorbs light is increased, the induction optical signals are increased, the current signals are improved, the accuracy of fingerprint detection and identification is improved, and high-quality fingerprint identification and detection are achieved. In addition, a manufacturing process of the fingerprint identification apparatus is simple, without adding extra structure(s) or process(s).

It is to be noted that, in this implementation mode, the interlayer insulating layer 160 may have a periodic shape, and certainly, the interlayer insulating layer 160 may not have a periodic shape. For example, the interlayer insulating layer 160 is formed by a combination of a prism, a trapezoid and so on.

For example, the photoelectric induction layer 302 may comprise a PN-type, a PIN-type, and the like. For example, the photoelectric induction layer 302 may comprise an organic photoelectric induction layer or an inorganic photoelectric induction layer. Example organic material used for the photoelectric induction layer 302 includes, for example, phthalocyanine and its derivatives, porphyrin and its derivatives, polyaniline and the like, and example inorganic material used for the photoelectric induction layer 302 includes, for example, silicon, germanium, gallium arsenide, lead sulfide and the like.

For example, the first electrode 301 may be an opaque electrode, and the second electrode 303 may be a transparent electrode. A material of the first electrode 301 may be an opaque conductive material, such as a copper-based metal, an aluminum-based metal, a nickel-based metal, or the like. For example, the copper-based metal comprises copper-based metal alloy with stable properties, such as copper (Cu), copper zinc alloy (CuZn), copper nickel alloy (CuNi) or copper zinc nickel alloy (CuZnNi), etc. A material of the second electrode 303 may be a transparent conductive material, such as indium tin oxide (ITO), indium zinc oxide (IZO), zinc oxide (ZnO), carbon nano and other transparent conductive oxide.

For example, the first electrode 301 covers over the thin film transistor 500, and the first electrode 301, for example, may completely cover a surface of the thin film transistor 500 facing the second substrate 200, and may further cover four sides (front, back, left and right) of the thin film transistor 500, so as to prevent or reduce the light coming from the second substrate 200 from irradiating onto the thin film transistor 500, and to improve the stability of the thin film transistor 500. Meanwhile, the embodiment can reduce a step of manufacturing the light shielding layer separately, so as to reduce the number of the process steps, shorten the manufacturing time, decrease the production cost, and improve the product quality.

For example, an exemplary material for the interlayer insulating layer 160 comprises silicon nitride (SiNx), silicon oxide (SiOx), silicon oxynitride (SiNxOy) or other suitable materials.

For example, the interlayer insulating layer 160, the first electrode 301, the photoelectric induction layer 302 and the second electrode 303 may be formed by methods such as an inkjet printing process, a vapor deposition method, a magnetron sputtering method or a vacuum deposition method, and the embodiment of the present disclosure is not limited thereto.

FIG. 4 is a partial structural schematic diagram of another implementation mode of a curved photoelectric induction part 3000 in the fingerprint identification apparatus provided by the embodiment. As shown in FIG. 4, the curved photoelectric induction part 3000 has a prism surface, and a cross-sectional shape of the curved photoelectric induction part 3000 has triangle shapes. Except that a periodic shape is a prismatic shape, the manufacturing process and the material of the curved photoelectric induction part 3000 are the same as the manufacturing process and the material in the implementation mode shown in FIG. 3, and similar description will be omitted here. The prism surface can increase the area in which the photoelectric induction layer 302 absorbs light, so as to increase the induction optical signals, and improve the sensed current signals.

FIG. 5 is a partial structural schematic diagram of yet another implementation mode of a curved photoelectric induction part 3000 in the fingerprint identification apparatus provided by the embodiment. As shown in FIG. 5, the curved photoelectric induction part 3000 has a cylindrical surface, and a cross-sectional shape of the curved photoelectric induction part 3000 has a wave shape. Except that a periodic shape is a cylindrical shape, the manufacturing process and the material of the curved photoelectric induction part 3000 are the same as the manufacturing process and the material in the implementation mode shown in FIG. 3, and similar description will be omitted here. The cylindrical surface can increase the area in which the photoelectric induction layer 302 absorbs light, so as to increase the induction optical signals, and improve the induction current signals.

It is to be noted that, in FIG. 3, FIG. 4 and FIG. 5, in order to more clearly show the structure of the curved photoelectric induction part 3000, a structure such as the thin film transistor 500 under the curved photoelectric induction part 3000 is omitted.

In the fingerprint identification apparatus of the embodiment, in a premise of without affecting the occupied area of the photoelectric induction unit 300, the photosensitive area can be increased by using the curved photoelectric induction part 3000, so as to improve the induction photocurrent signals, improve the accuracy of the fingerprint detection and identification, and achieve high-quality fingerprint detection. Further, if the first electrode 301 is used to block light from irradiating on the thin film transistor 500, a light shielding layer used for the thin film transistor 500 does not need to be separately disposed, and the stability of the thin film transistor 500 can be improved. Meanwhile, the process of preparing the light shielding layer alone can be reduced, the number of the process steps can be reduced, the preparing time can be shortened, the production cost can be reduced, and the product quality can be improved.

Second Embodiment

Figure 6:
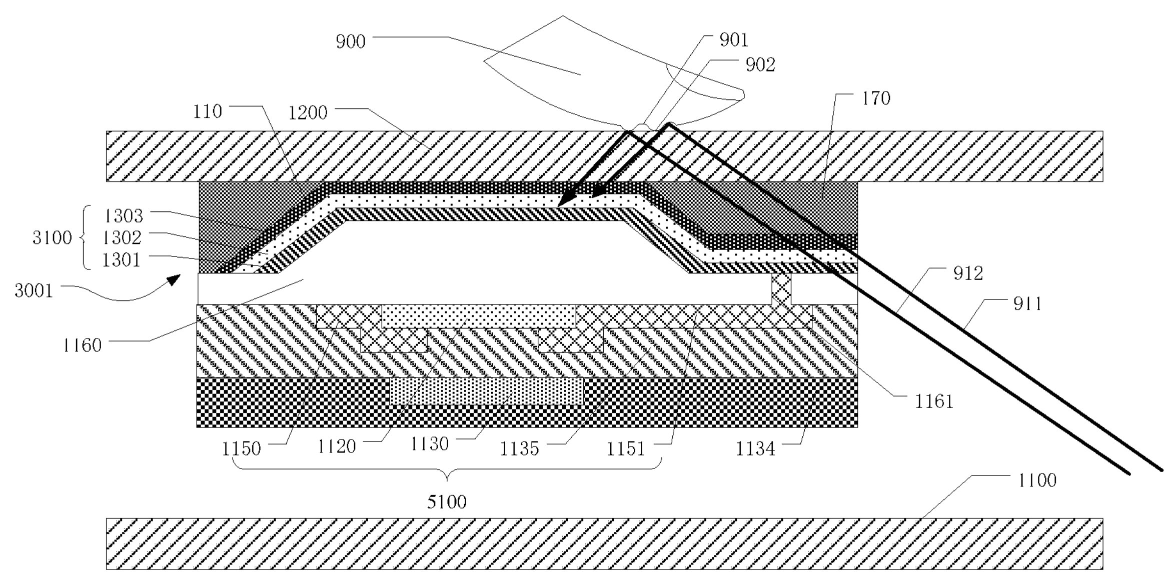
FIG. 6 is a partial cross-sectional schematic diagram of a fingerprint identification apparatus provided by another embodiment of the present disclosure.

FIG. 6 shows a partial cross-sectional schematic diagram of a fingerprint identification apparatus provided by the second embodiment. In the embodiment, the fingerprint identification apparatus may be disposed on the second substrate 1200 that can be touched by the finger. The fingerprint identification apparatus provided by the embodiment further comprises a first insulating layer 170. For example, the first insulating layer 170 may be a transparent insulating layer, a material of the first insulating layer 170 comprises one or more of silicon nitride (SiNx), silicon oxide (SiOx), and silicon oxynitride (SiNxOy). The first insulating layer 170 is disposed on the second substrate 1200. The first insulating layer 170 comprises a first recess 110, and to photoelectric induction unit 3100, an interlayer insulating layer 1160 and a thin film transistor 5100 are sequentially disposed in the first recess 110. The thin film transistor 5100 and the photoelectric induction unit 3100 overlap with each other in a direction perpendicular to the second substrate 1200.

For example, the thin film transistor 5100 comprises a gate electrode 1130, a gate insulating layer 1135, an active layer 1120, a third electrode 1150, and a fourth electrode 1151. The photoelectric induction unit 3100 comprises a first electrode 1301, a second electrode 1303 and a photoelectric induction layer 1302 sandwiched between the first electrode 1301 and the second electrode 1303. The interlayer insulating layer 1160 comprises a second via hole 1161 for exposing a part of the first electrode 1301, and the fourth electrode 1151 is electrically connected to the first electrode 1301 through the second via hole 1161. For example, as shown in FIG. 6, different from the first embodiment, in the second embodiment the thin film transistor 5100 is a top-gate thin film transistor. In this case, the gate electrode 1130 can block light coming from the direction of the first substrate 1100 from irradiating on the active layer 1120. Certainly, a light shielding layer for the thin film transistor 5100 may also be separately disposed on the first substrate 1100. The opaque first electrode 1301 can be used as a light shielding layer for the top-gate thin film transistor and block the light incident on the thin film transistor 5100 from the direction of the second substrate 1200. Thus, on the second substrate 1100, it is not necessary to form the light shielding layer separately for the thin film transistor 5100. Furthermore, a passivation layer 1134 and the like may also be formed on the gate electrode 1130. Respective layers in the embodiment can be prepared by adopting the materials described in the first embodiment. It is to be noted that, although only one photoelectric induction unit 3100 of the fingerprint identification apparatus is shown in the figure, one of ordinary skill in the art may know that a plurality of photoelectric induction units 3100 may be disposed on the second substrate 1200.

Figure 7:
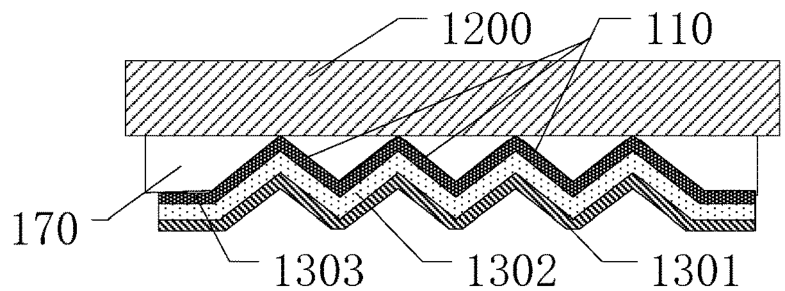
FIG. 7 is a partial structural schematic diagram of an implementation mode of a curved photoelectric induction part 3001 shown in FIG. 6.

FIG. 7 is a partial structural schematic diagram of an implementation mode of a curved photoelectric induction part 3001 provided by the embodiment.

The implementation mode of the curved photoelectric induction part 3001 provided by the embodiment may be the same as the implementation mode in first embodiment, but the order of the manufacturing processes is opposite. As shown in FIG. 7, firstly, the first insulating layer 170 is formed on the second substrate 1200, and the first insulating layer 170 comprises first recesses 110, for example, in the embodiment, four first recess 110 having periodic shapes are formed; and then the second electrode 1303, the photoelectric induction layer 1302 and the first electrode 1301, which are consistent with the shapes of the first recesses 110, are sequentially formed in the multiple first recesses 110, so as to constitute the curved photoelectric induction part 3001. It is to be noted that, in this implementation mode, each first recess 110 has a prismatic shape, and each first recess 110 may also have a cylindrical shape, a pyramid shape, a trapezoidal shape or a spherical shape as described in the first embodiment. The curved photoelectric induction part 3001 can increase the area in which the photoelectric induction layer 1302 absorbs light, so that the induction optical signals are increased, the current signals are improved, the accuracy of fingerprint detection and identification are improved, and high-quality fingerprint identification and detection are achieved. In addition, a manufacturing process of the fingerprint identification apparatus is simple, without adding extra structure(s) or process(s).

Third Embodiment

Figure 8:
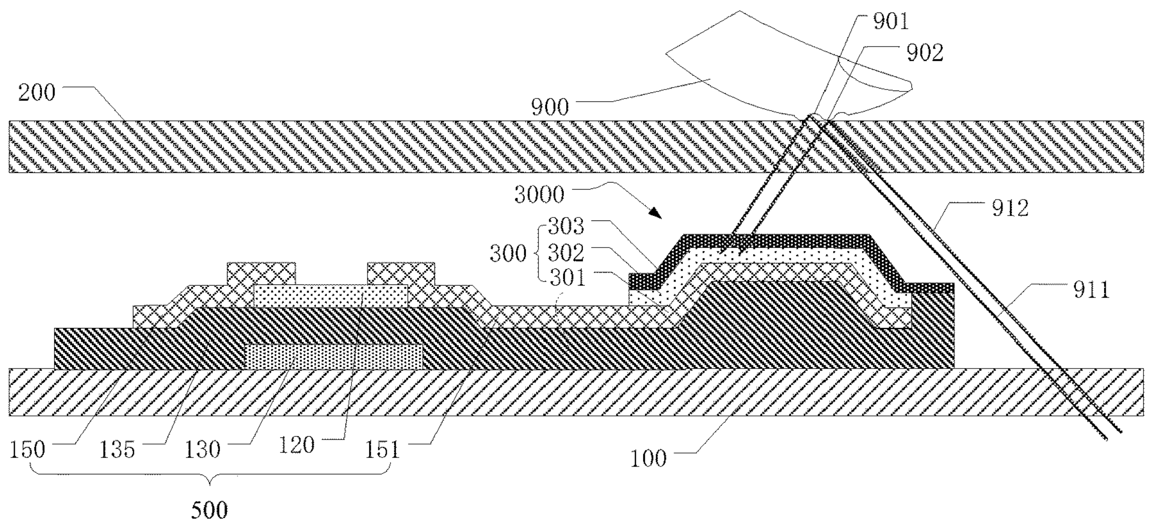
FIG. 8 is a partial cross-sectional schematic diagram of a fingerprint identification apparatus provided by yet another embodiment of the present disclosure.

FIG. 8 is a partial cross-sectional schematic diagram of a fingerprint identification apparatus provided by the third embodiment. In the first embodiment, the photoelectric induction unit 300 and the thin film transistor 500 overlap with each other in a direction perpendicular to the first substrate 100. In the fingerprint identification apparatus provided by the third embodiment, the photoelectric induction unit 300 and the thin film transistor 500 are arranged side-by-side in the direction perpendicular to the first substrate 100. In the embodiment, the thin film transistor 500 is a bottom-gate thin film transistor.

As shown in FIG. 8, in the embodiment, the first electrode 301 and the fourth electrode 151 are provided as an integral structure; that is, the first electrode 301 and the fourth electrode 151 are formed by a same conductive layer. Certainly, the first electrode 301 and the fourth electrode 151 may not be an integral structure, and a same technical effect can be achieved provided that the first electrode 301 and the fourth electrode 151 can be electrically connected. For example, light shielding layers may be further formed above and below the thin film transistor 500 to block light coming from the first substrate 100 and light coming from the second substrate 200 from irradiating onto the thin film transistor 500. Respective layers in the embodiment can be prepared by adopting the materials described in the first embodiment, and similar description will be omitted here.

The implementation mode of the photoelectric induction unit 3000 in the embodiment may be the same as the implementation mode in the first embodiment, and similar description will be omitted here.

Fourth Embodiment

Figure 9:
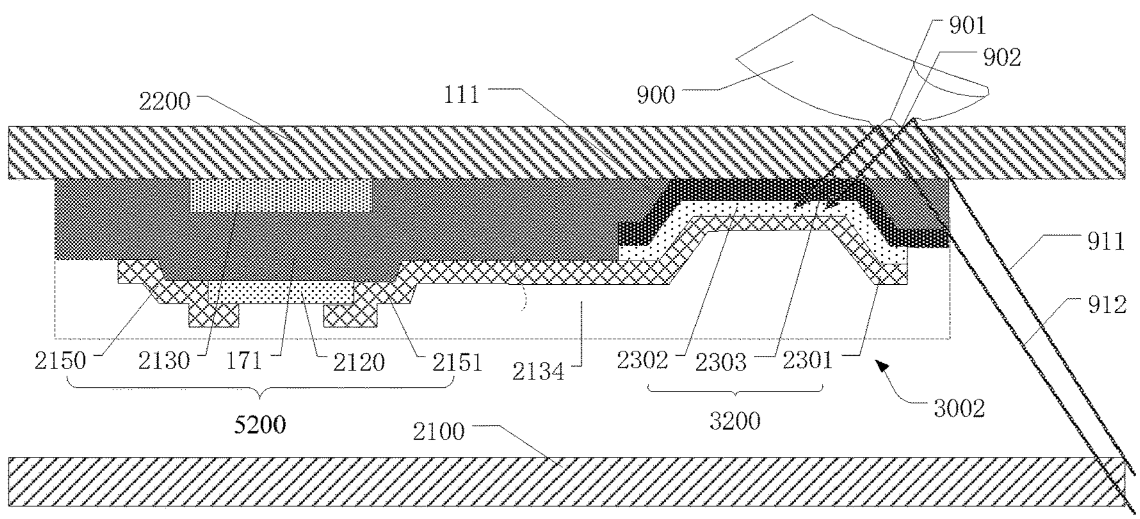
FIG. 9 is a partial cross-sectional schematic diagram of a fingerprint identification apparatus provided by still yet another embodiment of the present disclosure.
Figure 10:
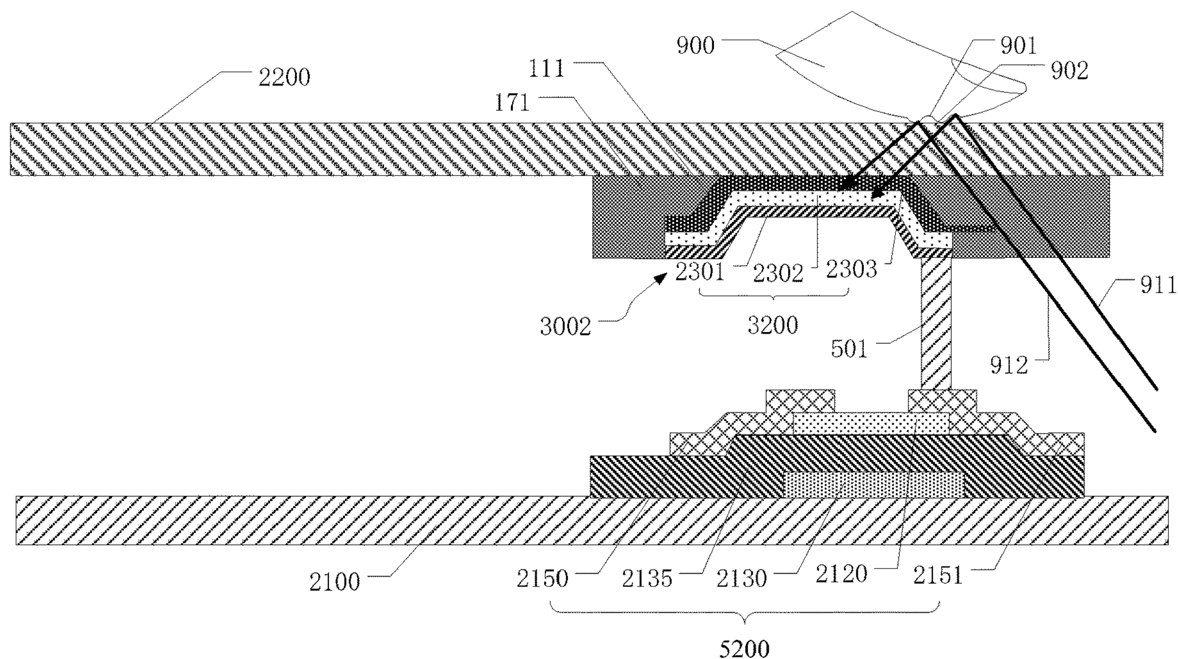
FIG. 10 is a partial cross-sectional schematic diagram of a fingerprint identification apparatus provided by still yet another embodiment of the present disclosure.

FIG. 9 and FIG. 10 show partial cross-sectional schematic diagrams of a fingerprint identification apparatus provided by the fourth embodiment. In the embodiment, the fingerprint identification apparatus is disposed on a second substrate 2200, and relative positions of respective layers are the same as those in the third embodiment. As shown in FIG. 9, the fingerprint identification apparatus provided by the embodiment further comprises a second insulating layer 171. For example, a material of the second insulating layer 171 may be the same material as the first insulating layer 170 in the second embodiment. For example, a gate electrode 2130 is disposed on the second substrate 2200, a second insulating layer 171 is disposed on the gate electrode 2130, and the second insulating layer 171 may be used as the gate insulating layer of the thin film transistor 5200. The second insulating layer 171 comprises a second recess 111, and a second electrode 2303, a photoelectric induction layer 2302 and a first electrode 2301 are sequentially disposed at the position of the second recess 111 to constitute a photoelectric induction unit 3200. An active layer 2120, a third electrode 2150 and a fourth electrode 2151 are further disposed at a position corresponding to the gate electrode 2130 to constitute a thin film transistor 5200. In the embodiment, the thin film transistor 5200 is a bottom-gate thin film transistor and is disposed on the second substrate 2200, and the gate electrode 2130 may block light coming from the second substrate 2200 from irradiating onto the active layer 2120. In a direction perpendicular to the second substrate 2200, the thin film transistor 5200 and the photoelectric induction unit 3200 do not overlap with each other. The first electrode 2301 and the fourth electrode 2151 may be provided as an integral structure; and the first electrode 2301 and the fourth electrode 2151 also may not be an integral structure, provided that the first electrode 2301 and the fourth electrode 2151 can be electrically connected. Furthermore, a passivation layer 2134 may be disposed on the thin film transistor 5200 and the photoelectric induction unit 3200. Respective layers in the embodiment can be prepared by the materials described in the first embodiment, and the similar description will be omitted here.

For example, as shown in FIG. 10, in the fingerprint identification apparatus provided by the embodiment, the thin film transistor 5200 may also be formed on the first substrate 2100. The thin film transistor 5200 comprises a gate insulating layer 2135. The fourth electrode 2151 of the thin film transistor 5200 and the first electrode 2301 of the photoelectric induction unit 3200 may be electrically connected to each other through a conductive spacer 501, and certainly may also be signally connected by other means, and the embodiment of the present is not limited thereto.

The implementation mode of the photoelectric induction unit 3002 in the embodiment may be the same as the implementation mode in the second embodiment, and similar description will be omitted here.

Fifth Embodiment

The embodiment provides an electronic device, which comprises the fingerprint identification apparatus described in any one of the above embodiments. The electronic device may be a product or component such as a television, a digital camera, a mobile photo, a watch, a tablet, a notebook computer, and a navigator, etc.

Figure 11A:
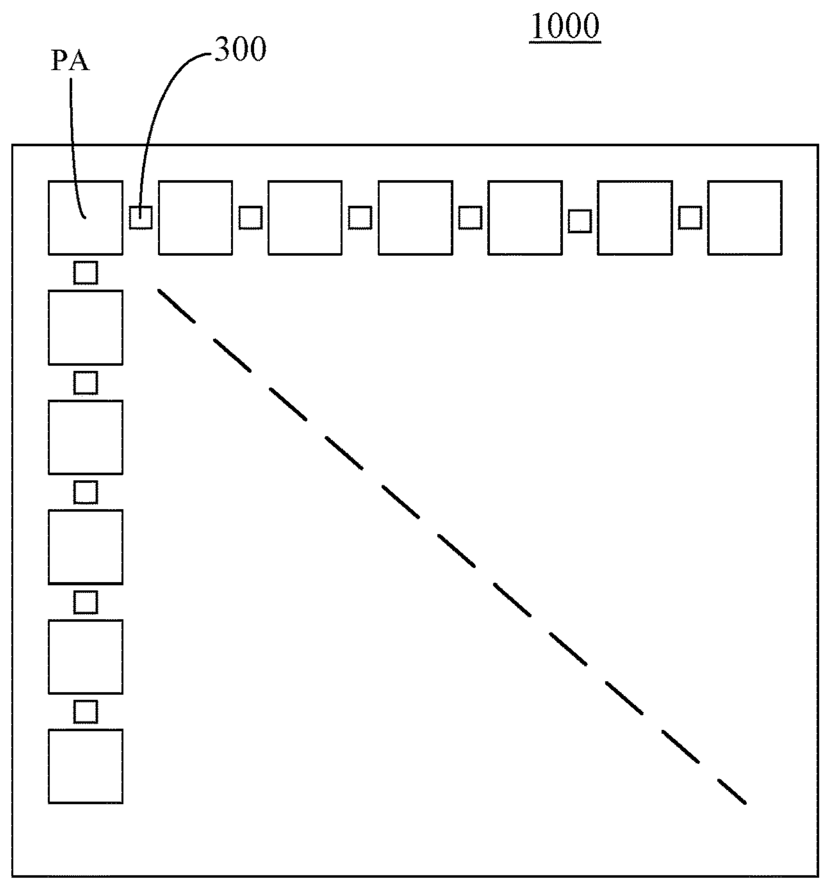
FIG. 11A is a schematic plan view of a display panel of an electronic device provided by an embodiment of the present disclosure.
Figure 11B:
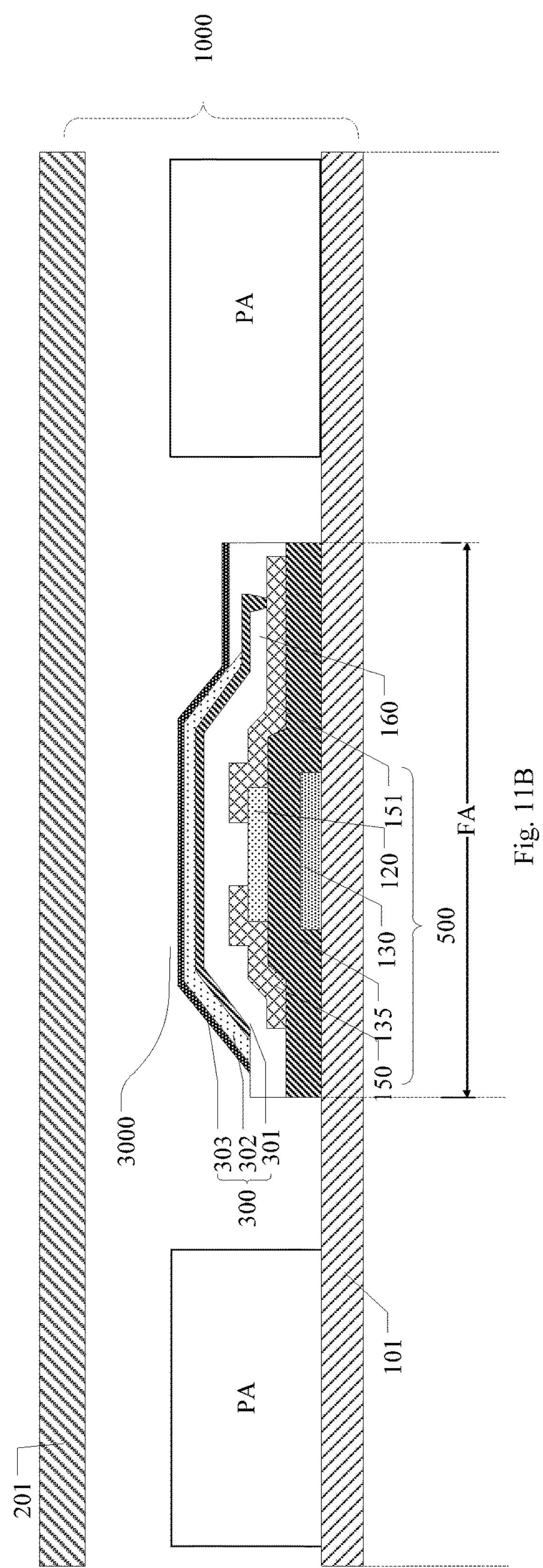
FIG. 11B is a partial cross-sectional structural schematic diagram of a display panel of an electronic device provided by an embodiment of the present disclosure.

FIG. 11A is a schematic plan view of a display panel of an electronic device provided by the embodiment; and FIG. 11B is a partial cross-sectional structural schematic diagram of the display panel of the electronic device provided by the embodiment.

For example, as shown in FIG. 11A and FIG. 11B, the electronic device provided by the embodiment further comprises a display panel 1000. The display panel 1000 is integrally formed with the fingerprint identification apparatus in any one of the above embodiments. The display panel 1000 comprises a plurality of pixel units PA arranged in an array. A plurality of photoelectric induction units 300 of the fingerprint identification apparatus is disposed in non-display areas FA between the plurality of pixel units PA. For example, as shown in FIG. 11A, a photoelectric induction unit 300 may be disposed between two adjacent pixel units PA. It is obvious that the embodiments of the present disclosure are not limited to this arrangement. For example, the fingerprint identification apparatus may be formed only in a part of the non-display areas FA, or may also be formed in all the non-display areas FA of the display panel.

For example, as shown in FIG. 11B, in the electronic device provided by the embodiment, the display panel 1000 comprises an array substrate 101 and an opposed substrate 201. The array substrate 101 corresponds to the first substrate 100 of the fingerprint identification apparatus, and the opposed substrate 201 corresponds to the second substrate 200 of the fingerprint identification apparatus.

For example, in FIG. 11B and the above description, an embodiment of the fingerprint identification apparatus shown in FIG. 2A is taken as an example for description purpose, but one of ordinary skill in the art should understand that other embodiments are equally applicable.

For example, in the electronic device provided by the embodiment, the display panel 1000 may be a liquid crystal display panel, and the opposed substrate 201 is a color filter substrate. For example, in the fingerprint identification apparatus, light for irradiating on a finger may come from a backlight source that is disposed on a rear side of the array substrate 101 relative to the opposed substrate 201. For example, the non-display areas FA may be a black matrix area in the liquid crystal display panel. The fingerprint identification apparatus shown in the first embodiment and the second embodiment can be formed in the black matrix area, and the fingerprint identification apparatus completely overlaps with the black matrix area in a direction perpendicular to the array substrate 101. Therefore, it is not necessary to separately form a light shielding layer for the photoelectric induction unit 300, so that the number of the process steps can be reduced and the cost can be saved.

For example, in the electronic device provided by the embodiment, the display panel 1000 may also be an organic light-emitting diode display panel, and the opposed substrate 201 is, for example, a package substrate. For example, in the fingerprint identification apparatus, light for irradiating on a finger may be light emitted by an organic light emitting element on the array substrate 101.

It is to be noted that, for clarity, an entirety of the structure of the electronic device is not shown. In order to achieve the required functions of the electronic device, one of ordinary skill in the art may set other structures not described according to specific application scenarios, which is not limited in the present disclosure.

At least one embodiment of the present disclosure provides a fingerprint identification apparatus and an electronic device having the fingerprint identification apparatus, and has at least one of following beneficial effects:

(1) the fingerprint identification apparatus can increase a photosensitive area of the photoelectric induction unit by using the curved photoelectric induction part without affecting an occupied area of the photoelectric induction unit, so as to improve the induction photocurrent signals, improve the accuracy of the fingerprint detection and identification, and achieve high-quality fingerprint identification and detection; and (2) in the embodiments of the fingerprint identification apparatus, an opaque first electrode can cover a top surface and four sides (front, back, left and right) of a thin film transistor, so as to better block external light and improve stability of the thin film transistor.

For the present disclosure, the following points should be noted:

(1) the accompanying drawings involve only the structure(s) in connection with the embodiment(s) of the present disclosure, and other structure(s) can be referred to with common design(s);

(2) for the purpose of clarity only, in the accompanying drawings for illustrating the embodiment(s) of the present disclosure, a thickness of a layer or an area may be enlarged or shrunk, that is, the drawings are not drawn in an actual scale; and (3) without conflict, features in one embodiment or in different embodiments can be combined to obtain new embodiment(s).

What have been described above are only specific implementations of the present disclosure, the protection scope of the present disclosure is not limited thereto, and the protection scope of the present disclosure should be based on the protection scope of the claims.

The application claims priority to the Chinese patent application No. 201710001752.3, filed Jan. 3, 2017, the entire disclosure of which is incorporated herein by reference as part of the present application.

What is claimed is:

1. A fingerprint identification apparatus, comprising:

a first substrate;

a second substrate located opposite to the first substrate;

a fingerprint identification sensor between the first substrate and the second substrate, wherein the fingerprint identification sensor comprises a plurality of photoelectric induction units, and each of the photoelectric induction units comprises a curved photoelectric induction part; and a thin film transistor configured to drive a corresponding photoelectric induction unit, wherein the thin film transistor configured to drive the corresponding photoelectric induction unit and a curved photoelectric induction part of the corresponding photoelectric induction unit are overlapped with each other in a direction perpendicular to the first substrate, and a surface of the curved photoelectric induction part of the corresponding photoelectric induction unit facing toward the thin film transistor is a concave surface.

2. The fingerprint identification apparatus according to claim 1, wherein each photoelectric induction unit comprises a first electrode, a second electrode and a photoelectric induction layer sandwiched between the first electrode and the second electrode.

3. The fingerprint identification apparatus according to claim 2, wherein one of the first electrode and the second electrode is an opaque electrode and another of the first electrode and the second electrode is a transparent electrode.

4. The fingerprint identification apparatus according to claim 1, wherein the curved photoelectric induction part is selected from the group of a prism surface, a pyramid surface, a trapezoidal surface, a spherical surface and a cylindrical surface.

5. The fingerprint identification apparatus according to claim 1, further comprising an interlayer insulating layer, wherein the thin film transistor is on the first substrate, the interlayer insulating layer is on the thin film transistor, and the fingerprint identification sensor is on the interlayer insulating layer.

6. The fingerprint identification apparatus according to claim 1, wherein the thin film transistor is on the first substrate, and the fingerprint identification sensor is on the thin film transistor.

7. The fingerprint identification apparatus according to claim 1, further comprising a first insulating layer and an interlayer insulating layer, wherein the first insulating layer is on the second substrate, the first insulating layer comprises a first recess, the photoelectric induction unit is in the first recess, the interlayer insulating layer is on the photoelectric induction unit, and the thin film transistor is on the interlayer insulating layer.

8. The fingerprint identification apparatus according to claim 1, further comprising a second insulating layer, wherein the second insulating layer is on the second substrate, the second insulating layer comprises a second recess, and the photoelectric induction unit is in the second recess; and wherein the thin film transistor is on the first substrate, and the thin film transistor is electrically connected to the photoelectric induction unit through a conductive spacer.

9. An electronic device, comprising the fingerprint identification apparatus according to claim 1.

10. The electronic device according to claim 9, further comprising a display panel, wherein the display panel and the fingerprint identification apparatus are formed integrally.

11. The electronic device according to claim 10, wherein the display panel comprises a plurality of pixel units, and each of the plurality of photoelectric induction units of the fingerprint identification apparatus is between the plurality of pixel units of the display panel.

12. The electronic device according to claim 10, wherein the display panel comprises an array substrate and an opposed substrate, the array substrate corresponds to the first substrate of the fingerprint identification apparatus, and the opposed substrate corresponds to the second substrate of the fingerprint identification apparatus; and the display panel is a liquid crystal display panel and the opposed substrate is a color filter substrate, or, the display panel is an organic light-emitting diode display panel and the opposed substrate is a package substrate.

13. The fingerprint identification apparatus according to claim 1, wherein the curved photoelectric induction part of the corresponding photoelectric induction unit comprises a first inclined portion, an intermediate connection part and a second inclined portion that are sequentially connected with each other in a first direction;

the first inclined portion and the second inclined portion respectively intersect with the first substrate;

a size, in the first direction, of an orthographic projection of the intermediate connection part on the first substrate is greater than a size, in the first direction, of an orthographic projection of an active layer of the thin film transistor on the first substrate; and the first direction is parallel to the first substrate.

14. A fingerprint identification apparatus, comprising:

a first substrate;

a second substrate located opposite to the first substrate;

a fingerprint identification sensor between the first substrate and the second substrate, wherein the fingerprint identification sensor comprises a plurality of photoelectric induction units, and each of the photoelectric induction units comprises a curved photoelectric induction part; and a thin film transistor configured to drive a corresponding photoelectric induction unit, wherein the thin film transistor and a curved photoelectric induction part of the corresponding photoelectric induction unit are arranged in parallel along a direction parallel to the first substrate, and a first electrode of the photoelectric induction unit of the corresponding photoelectric induction unit is directly and electrically connected with a fourth electrode of the thin film transistor.

15. The fingerprint identification apparatus according to claim 14, further comprising a second insulating layer, wherein the second insulating layer is on the second substrate, the second insulating layer comprises a second recess, and the photoelectric induction unit is in the second recess; and wherein the thin film transistor is on the second substrate, and in a direction perpendicular to the second substrate, the thin film transistor does not overlap with the photoelectric induction unit.

16. The fingerprint identification apparatus according to claim 14, wherein the thin film transistor is on the first substrate;

an insulation layer for forming a gate insulating layer of the thin film transistor comprises a protrusion protruded toward the second substrate;

the protrusion and an active layer of the thin film transistor are arranged in parallel along the direction parallel to the first substrate;

the protrusion and the curved photoelectric induction part of the corresponding photoelectric induction unit are overlapped with each other in a direction perpendicular to the first substrate; and a surface of the curved photoelectric induction part of the corresponding photoelectric induction unit facing toward the protrusion is a concave surface.

17. The fingerprint identification apparatus according to claim 14, wherein the first electrode of the photoelectric induction unit of the corresponding photoelectric induction unit and the fourth electrode of the thin film transistor are provided as an integral structure.

* * * * *